United States Patent
Sinha et al.

(10) Patent No.: US 6,787,450 B2
(45) Date of Patent: Sep. 7, 2004

(54) HIGH ASPECT RATIO FILL METHOD AND RESULTING STRUCTURE

(75) Inventors: Nishant Sinha, Boise, ID (US); Paul A. Morgan, Kuna, ID (US)

(73) Assignee: Micron Technology, Inc., Boise, ID (US)

(*) Notice: Subject to any disclaimer, the term of this patent is extended or adjusted under 35 U.S.C. 154(b) by 2 days.

(21) Appl. No.: 10/156,097

(22) Filed: May 29, 2002

(65) Prior Publication Data

US 2003/0230808 A1 Dec. 18, 2003

(51) Int. Cl.[7] .......................................... H01L 21/4763
(52) U.S. Cl. ...................... 438/630; 438/649; 438/655; 438/656; 438/675
(58) Field of Search ................................. 438/630, 649, 438/655, 656, 675

(56) References Cited

U.S. PATENT DOCUMENTS

| | | | |
|---|---|---|---|
| 4,692,349 A | | 9/1987 | Georgiou et al. |
| 4,800,177 A | * | 1/1989 | Nakamae .................. 438/627 |
| 5,169,680 A | * | 12/1992 | Ting et al. ................ 438/629 |
| 5,308,796 A | * | 5/1994 | Feldman et al. ........... 438/655 |
| 5,888,903 A | * | 3/1999 | O'Brien et al. ............ 438/649 |
| 5,913,147 A | * | 6/1999 | Dubin et al. .............. 438/687 |
| 5,969,422 A | * | 10/1999 | Ting et al. ................ 257/762 |
| 5,985,103 A | | 11/1999 | Givens et al. |
| 6,180,469 B1 | * | 1/2001 | Pramanick et al. ........ 438/299 |
| 6,297,156 B1 | | 10/2001 | Farrar et al. |
| 6,326,303 B1 | | 12/2001 | Robinson et al. |
| 6,331,482 B1 | | 12/2001 | Honeycutt et al. |
| 6,359,328 B1 | * | 3/2002 | Dubin ...................... 257/622 |
| 2002/0127790 A1 | * | 9/2002 | Hongo et al. ............. 438/200 |

FOREIGN PATENT DOCUMENTS

JP          2-50432       *  2/1990

OTHER PUBLICATIONS

Wei et al., The Use of Selective Electroless Metal Deposition for Micron Size Contact Fill, IEEE 1988, pp. 446–449.*

* cited by examiner

Primary Examiner—Amir Zarabian
Assistant Examiner—Jeff Vockrodt
(74) Attorney, Agent, or Firm—Dickstein Shapiro Morin & Oshinsky LLP (57) ABSTRACT

A method is described for filling of high aspect ratio contact vias provided over silicon containing areas. A via is formed in an insulating layer over the silicon containing area and a silicide forming material is deposited in the via. A silicide region is formed over the silicon containing area, the silicide forming material is removed from the via leaving the silicide region. The via is then filled with a conductor using an electroless plating process.

25 Claims, 5 Drawing Sheets

HIGH ASPECT RATIO FILL METHOD AND RESULTING STRUCTURE

FIELD OF THE INVENTION

The present invention relates generally to semiconductor devices, and more specifically to processes for deposition and filling of contact areas in semiconductors. In particular, this invention relates to processes used to fill via contact regions.

BACKGROUND

With reduction in the size and dimensions of transistor features, more components are placed on each chip, which increases the complexity of the fabrication process as well as contact densities and aspect ratios.

The ever increasing circuit density has also resulted in increasing aspect ratios for various structures formed during the manufacture of integrated circuits. Particularly for such structures as contacts and vias, higher aspect ratios have had a negative effect on fabrication yields. Aspect ratio is defined herein as the height/width ratio of a feature.

Adequate filling of high aspect ratio contacts and vias using previous employed methods has been somewhat difficult to achieve. Previous attempts at filling contacts, in particular contacts with high aspect ratios, often produce contacts with void spaces, also termed keyholes. These keyholes are problematic in that they are known to affect the conductivity of the contact and may also deform fabricated structures.

Previous techniques have attempted to address the problems associated with keyhole formation, for example the use of chemical vapor deposition of metals (CVD), and laser reflow and aluminum reflow methods. These techniques, however, do not entirely solve the problems associated with keyhole formation. In particular, as the aspect ratio increases, metal deposited at colder temperatures fails to produce good step coverage due to "necking" (or "cusping") at the top corners of contacts. The use of flared or tiered corners for the vias has also been utilized, however, altering the geometry of via corners often results in the loss of semiconductor area. Use of a partially ionized beam (PIB) to deposit a metal layer is often not practical due to low deposition rates which reduces throughput and increases the risk of gaseous inclusion into the metal layer. In multi-step metallization processes, keyholes often form if insufficient metal is deposited. Keyhole formation is also problematic using directed vapor deposition (DVD) for several reasons, including negative effects on the conductivity of the channel and deformation of metals in the transistor components of the semiconductor.

For example, known methods for creating contacts in high aspect ratio vias have often involved filling the holes with deposited metal layers such as a sequentially layered stack of titanium (Ti), titanium nitride (TiN) and tungsten (W), i.e. a W/TiN/Ti stack. However, filling of high aspect ratio via holes with common stack of W/TiN/Ti produces keyholes. Electroless processes for filling of a high aspect ratio contact utilizing nickel (Ni) or cobalt (Co) have also been found to produce undesirable keyhole formation.

Consequently, a need exists for a practical and efficient method for filling high aspect ratio contacts. In particular, a need exists for a low cost and efficient process that may be used to fill high aspect contacts in a void-free manner.

SUMMARY OF THE INVENTION

The present invention provides a method for producing contacts in high aspect ratio vias or holes which have fewer or no voids using a bottom-up electroless plating technique. The method comprises forming an insulating layer over a semiconductor substrate; forming an opening in the insulating layer to an area containing silicon; depositing a conductive material within the opening; forming a silicide layer at the interface of the conductive material and the area containing silicon; removing the conductive material from the opening while leaving the silicide layer; and forming a conductor within the opening by electroless plating over the silicide layer.

In another aspect, the invention is directed to a semiconductor structure comprising a semiconductor substrate having an insulating layer over said semiconductor substrate; an opening in said insulating layer to an area containing silicon; a silicide layer formed at the interface of said opening and said area containing silicon; and an electrolessly plated conductor formed over said silicide layer within said opening.

BRIEF DESCRIPTION OF THE DRAWINGS

The foregoing and other advantages and features of the invention will become more apparent from the detailed description of preferred embodiments of the invention given below with reference to the accompanying drawings wherein.

DETAILED DESCRIPTION

In the following detailed description, reference is made to various specific embodiments in which the invention may be practiced. These embodiments are described with sufficient detail to enable those skilled in the art to practice the invention, and it is to be understood that other embodiments may be employed, and that structural changes may be made without departing from the spirit or scope of the present invention.

The terms "substrate" and "wafer" can be used interchangeably in the following description and may include any semiconductor-based structure. The structure should be understood to include silicon, silicon-on insulator (SOI), silicon-on-sapphire (SOS), doped and undoped semiconductors, epitaxial layers of silicon supported by a base semiconductor foundation, and other semiconductor structures. The semiconductor need not be silicon-based. The semiconductor could be silicon-germanium, germanium, or gallium arsenide. When reference is made to the substrate in the following description, previous process steps may have been utilized to form regions or junctions in or over the base semiconductor or foundation.

The term "metal" is intended to include not only elemental metal, but can include metal with other trace metals or in various alloyed combinations with other metals as known in the semiconductor art, as long as such alloy retains the physical and chemical properties of a metal. The term "metal" is also intended to include conductive oxides of such metals.

The term "high aspect ratio" is intended to describe a height-to-width ratio of any opening, including a contact via, formed in an insulating layer over a semiconductor substrate, that is greater than 1, that is, a height-to-width ratio that is greater than 1:1. For example, a high aspect ratio via may have a height of about 2 microns and a width of about 0.15 microns, giving a height to width ratio of about 13.3.

Figure 1:
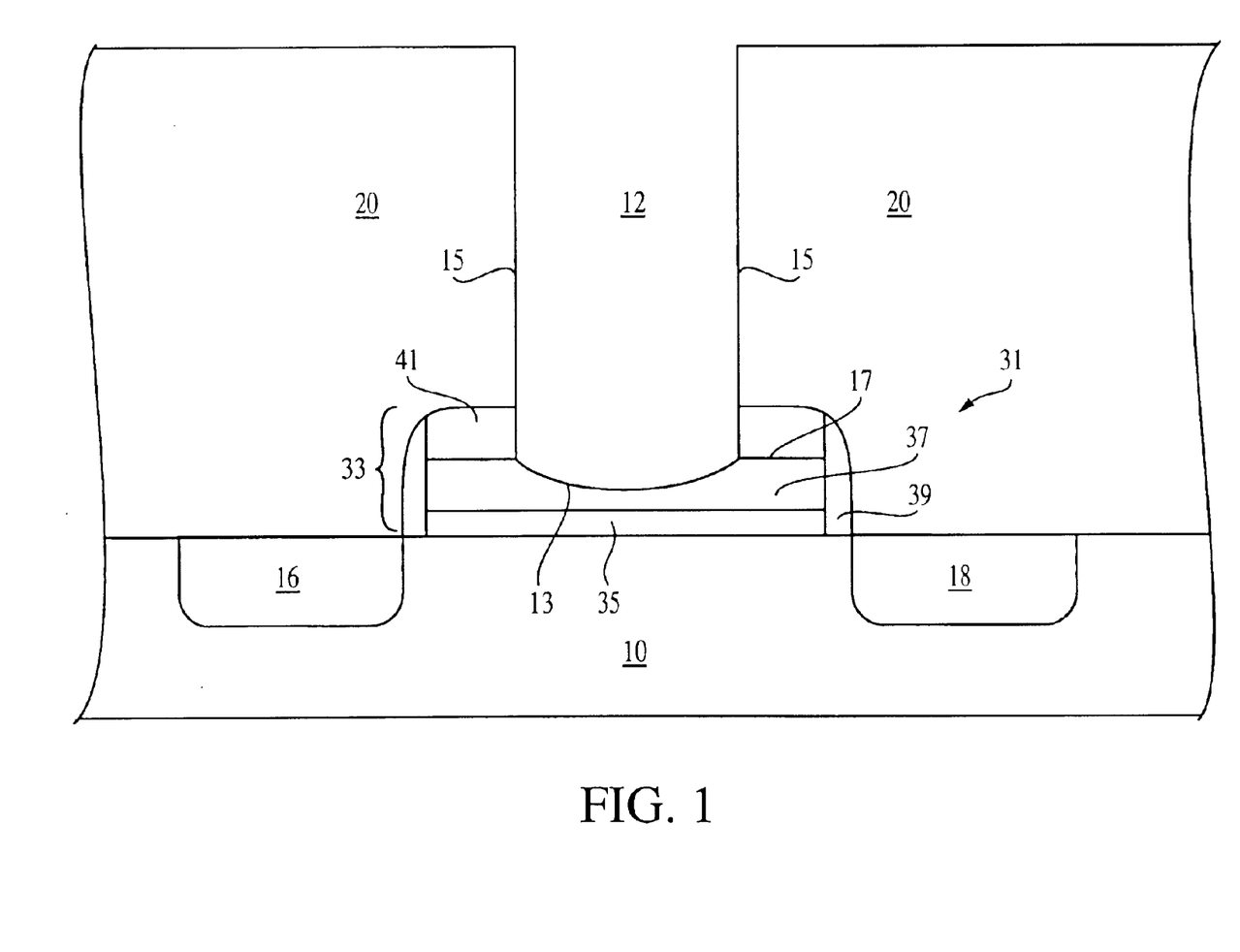
FIG. 1 depicts a via etched down to a transistor polysilicon gate region.

Now referring to the figures, where like reference numbers designate like elements, FIG. 1 depicts a semiconductor substrate 10 in and on which a transistor 31 has been fabricated having source/drain regions 16, 18 and a gate stack 33. The gate stack includes a gate oxide 35, a conductive polysilicon gate 37, insulating spacers 39 and an insulating cap layer 41. Transistor 31 is fabricated using conventional techniques and is shown merely to show one environment of many in which the present invention may be employed. An overlying insulating layer 20 is also shown which, in practice, may be formed of one or more insulating layers.

It is often desired to provide a conductive contact to the gate conductor 37 of transistor 31, or to source/drain regions 16, 18. For purposes of illustrating the invention, contact formation to gate conductor 37 will be illustrated; however, it should be understood that the invention is applicable to providing vertical contacts to other portions of an integrated circuit.

FIG. 1 further depicts in schematic manner a contact via 12 which has been etched into insulating layer 20. The contact via 12 is not limited in shape or dimensions to the depiction in the accompanying figures, but instead can be formed to any shape and dimensions desired. In the illustrated embodiment, the contact via 12 has a circular, horizontal cross-sectional profile and side wall surfaces 15 that are substantially orthogonal to the generally horizontal planar surface of a bottom surface 13. The bottom surface 13 of the contact via 12 is shown in FIG. 1 as extending slightly beneath the top surface 17 of the conductive polysilicon gate 37.

Figure 2:
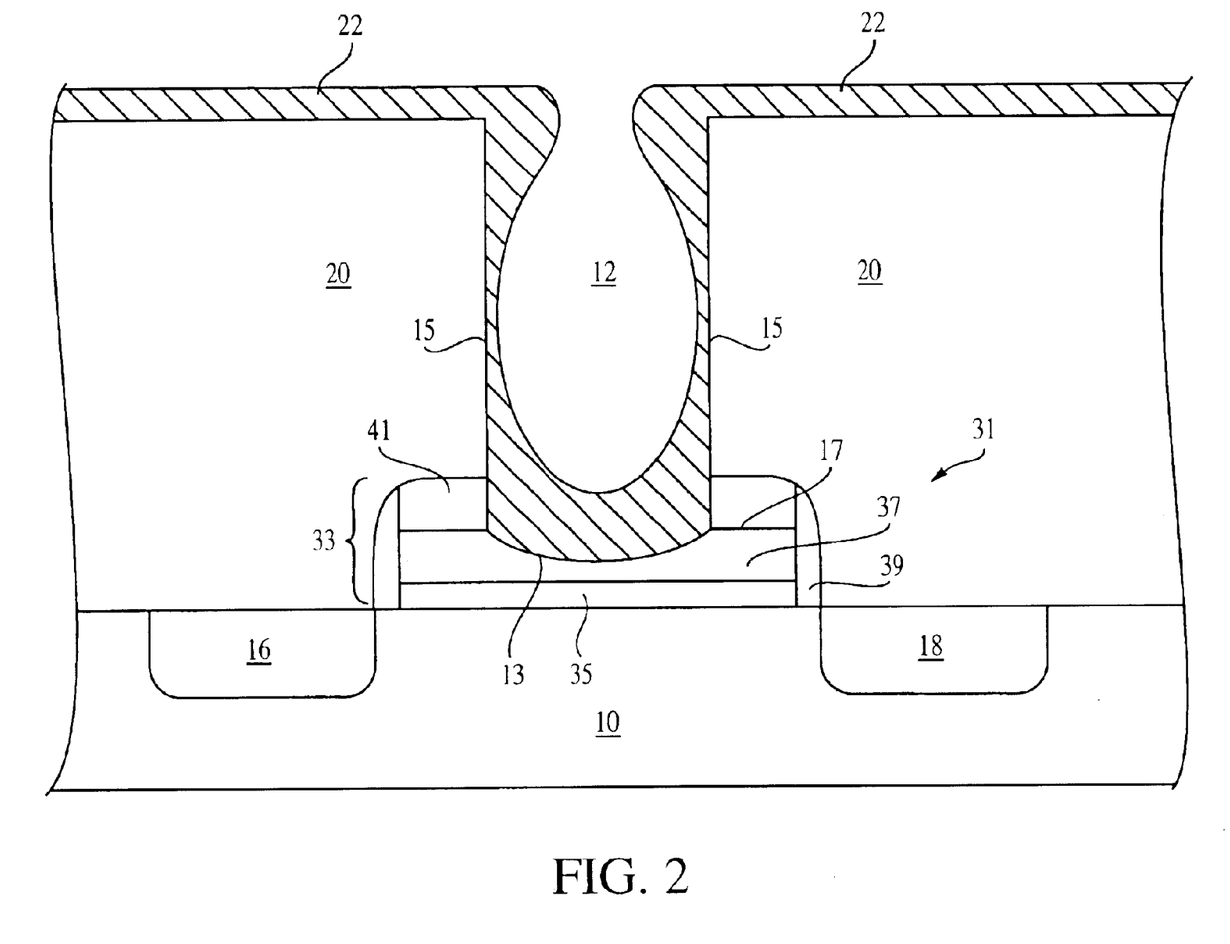
FIG. 2 depicts the via of FIG. 1 with a conductive material deposited over the surface of the via and the insulating layer surrounding the via.

Turning to FIG. 2, after the contact via 12 is etched, a layer of titanium (Ti) 22 is blanket deposited over the bottom 13 and sidewalls 15 of via 12 and on the upper surface of insulating layer 20. As shown, due to a high aspect ratio of via 12, the upper portion of the via 12 is narrowed by the titanium deposition. The titanium (Ti) layer 22 shown in FIG. 2 may be deposited on the surface of said contact via 12 by any method known to those skilled in the relevant art, including but not limited to a CVD process.

Figure 3:
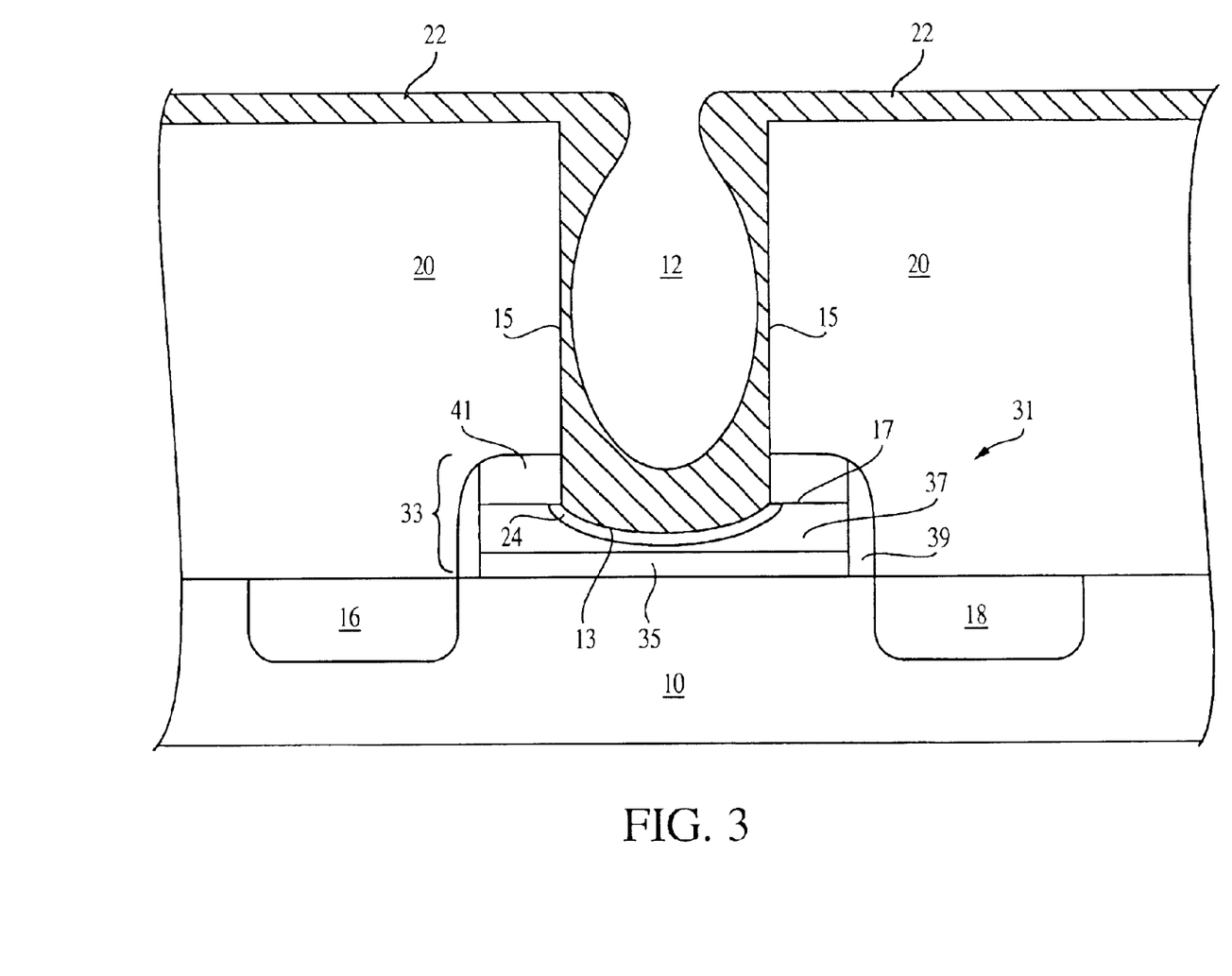
FIG. 3 depicts the via of FIG. 2 with a silicide layer formed at the interface of the conductive material and the transistor polysilicon gate region.

Following titanium deposition, the illustrated structure is heat annealed to form a titanium silicide (TiSi) layer 24 at the bottom of the via 12 at the titanium/polysilicon gate interface, as shown in FIG. 3. Alternatively, the deposition conditions for titanium layer 22 can be performed at a high enough temperature to form the titanium silicide layer 24, without using a subsequent heat anneal step.

Although in the preferred embodiment of the invention, titanium silicide is formed at the bottom of via 12, those skilled in the art will recognize that other silicide forming metals may be employed in place of titanium, for example, tungsten (W), cobalt (Co), nickel (Ni) or other metal. In such cases these metals are deposited within the via 12 in lieu of the titanium deposition and proceed to form a silicide at the bottom of the via 12. Titanium silicide is preferred over Co and Ni silicides as Co and Ni silicides have the disadvantages of high silicon consumption and $N^+$ junction leakage. Though in other memory products, where this can be overcome, selective Co or Ni deposition can be done at the bottom of the plug by electroless plating. Co or Ni silicides can then be formed by annealing at elevated temperatures.

Following titanium silicide layer 24 formation, the titanium layer 22 is etched relative to the titanium silicide layer 24 such that all titanium is removed from the surface of insulating layer 20 and the contact via 12, leaving the titanium silicide layer 24 in place. While a preferred embodiment is to completely remove all of the titanium layer 22 from the surface of insulating layer 20 and the contact via 12, it is also possible to partially etch back the titanium layer 22 to reduce or narrow the necking effect of the titanium layer 22 (as depicted in FIG. 3) before plating a conductor over the titanium silicide layer 24. The titanium layer 22 can be etched or otherwise stripped by any methods and conditions known and/or used by those skilled in the relevant art. For example, one method for etching or stripping the titanium layer 22 uses a mixture comprising ammonium hydroxide and hydrogen peroxide.

After the titanium is stripped off, an activating solution is used to remove oxides and oxide-containing compounds from the titanium silicide layer 24. During the activation process, the titanium silicide (TiSi) layer 24 is etched slightly. An ammonium peroxide containing mixture may be used for this etching. Other activation methods include contacting the silicide layer 24 with hydrofluoric acid (HF) alone or a mixture of HF and palladium chloride ($PdCl_2$). In one embodiment, an activating solution may comprise at least about 0.05 weight percent to about 0.5 weight percent hydrofluoric acid. Alternatively, an activating solution may comprise about 0.1 weight percent hydrofluoric acid. Palladium chloride may be used at any concentration effective for the activation process, including but not limited to any concentration between at least about 0.001 M and about 0.1 M. Other isotopes or nuclides of Pd or other conductive metals may also be used in the etching process, including any combination of elements that exhibit different oxidation states, electronegativity values, or other physical and/or chemical properties. The activating solution used for the invention may also include one or more surfactants, including Triton X-100™ (i.e. octylphenol ethylene oxide condensate, or octoxynol-9) or RE-610 (i.e. nonylphenol ethoxylate). Triton X-100™ or RE-610 may be used at any concentration effective for the activation process, including but not limited to any concentration from at least about 0.5 ml/liter to about 4.0 ml/liter. A surfactant may be used during the activation process for any time desired. The contact via 12 may be rinsed with a rinsing solution, such as water, before electroless plating.

Figure 4:
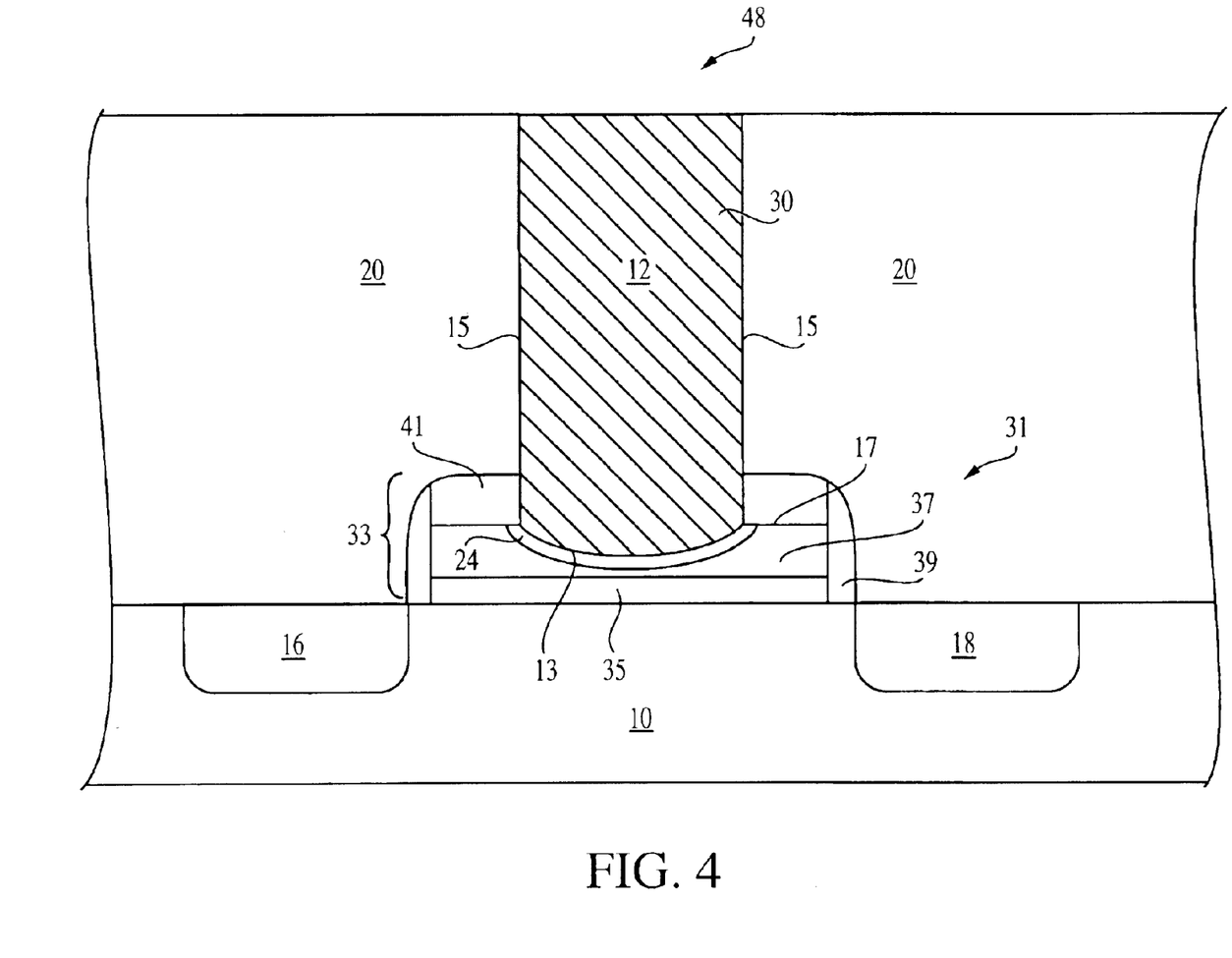
FIG. 4 depicts the via of FIG. 3 after removal of the conductive material, wherein the silicide layer remains, and wherein a conductor has been formed within the via over the silicide layer.

FIG. 4 shows a contact via 12 with a titanium silicide layer 24 at the interface of the bottom surface 13 of the contact via 12 and the transistor polysilicon gate region 37. Also shown is a conductive plug 30 which has been deposited by electroless plating to form a conductor within the contact via 12. Any conductive metal which can be electrolessly plated may be used to form a conductor within the contact via 12. For example, electroless plating may be performed using any one or combination of nickel (Ni), nickel alloy, cobalt (Co), and cobalt alloy. Examples include nickel (Ni); Ni and phosphorus (P); Cobalt (Co); Co and P;

and Ni, Co and P. Tungsten (W), titanium (Ti), and tantalum (Ta) may also be used with any one or combination of other conductive metal described herein to form a conductor within the contact via 12; however; neither tungsten (W) alone, titanium (Ti) alone, or tantalum (Ta) alone may be used to form a conductor within the contact via 12. Alternatively, boron (B) may be substituted for phosphorus (P) for use in combination with the conductive metals. When Co or Ni silicides are formed at the bottom plug, these can be selectively activated for further bottom-up electroless plating.

One solution that may be used for electroless plating of a conductive metal includes with a reducing agent, for example ammonium hypophosphite, a complexing agent, such as malonate, and a surfactant, such as Triton X-100™ or RE-610. Triton X-100 or RE-610 may be used at any concentration effective for electroless plating, including but not limited to any concentration from at least about 0.5 ml/liter to about 4.0 ml/liter. A preferred pH for the surfactant is about pH 3.8, although the pH can alternatively be anywhere in the range of about 3.5 to 4.5. Conditions for electroless plating of nickel may include plating at 6000 angstroms per hour at about 60 degrees Celsius.

Figure 5:
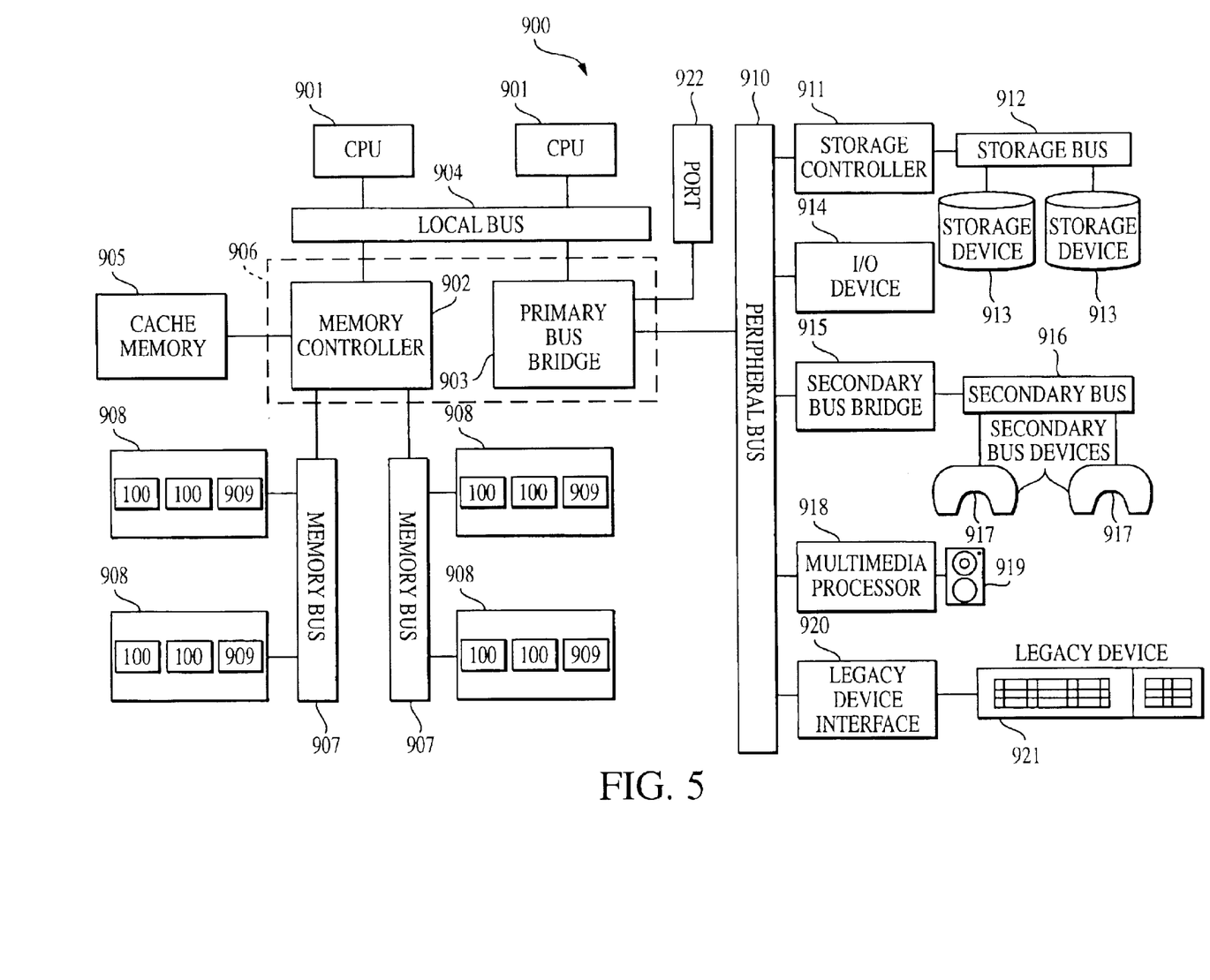
FIG. 5 depicts an exemplary processing system which may utilize a memory device, and wherein any one of the electronic components shown in FIG. 5 may be fabricated as an integrated circuit containing contact vias formed in accordance with the present invention.

The invention provides a simple process for creating reliable contacts 30 in high aspect ratio vias without keyholes being formed. FIG. 5 illustrates an exemplary processing system 900 which may utilize a memory device 100. Any one of the electronic components shown in FIG. 5, including CPU 901 and memory device 100, may be fabricated as an integrated circuit containing contact vias formed in accordance with the present invention. The processing system 900 includes one or more processors 901 coupled to a local bus 904. A memory controller 902 and a primary bus bridge 903 are also coupled the local bus 904. The processing system 900 may include multiple memory controllers 902 and/or multiple primary bus bridges 903. The memory controller 902 and the primary bus bridge 903 may be integrated as a single device 906.

The memory controller 902 is also coupled to one or more memory buses 907. Each memory bus accepts memory components 908 which include at least one memory device 100, wherein memory device 100 includes the present invention 48. The memory components 908 may be a memory card or a memory module. Examples of memory modules include single inline memory modules (SIMMs) and dual inline memory modules (DIMMs). The memory components 908 may include one or more additional devices 909. For example, in a SIMM or DIMM, the additional device 909 might be a configuration memory, such as a serial presence detect (SPD) memory. The memory controller 902 may also be coupled to a cache memory 905. The cache memory 905 may be the only cache memory in the processing system. Alternatively, other devices, for example, processors 901 may also include cache memories, which may form a cache hierarchy with cache memory 905. If the processing system 900 include peripherals or controllers which are bus masters or which support direct memory access (DMA), the memory controller 902 may implement a cache coherency protocol. If the memory controller 902 is coupled to a plurality of memory buses 907, each memory bus 907 may be operated in parallel, or different address ranges may be mapped to different memory buses 907.

The primary bus bridge 903 is coupled to at least one peripheral bus 910. Various devices, such as peripherals or additional bus bridges may be coupled to the peripheral bus 910. These devices may include a storage controller 911, an miscellaneous I/O device 914, a secondary bus bridge 915, a multimedia processor 918, and an legacy device interface 920. Secondary bus 916 may be coupled to secondary bridge bus 915, and legacy device 921 may be coupled to legacy device interface 920. The primary bus bridge 903 may also coupled to one or more special purpose high speed ports 922. In a personal computer, for example, the special purpose port might be the Accelerated Graphics Port (AGP), used to couple a high performance video card to the processing system 900.

The storage controller 911 couples one or more storage devices 913, via a storage bus 912, to the peripheral bus 910. For example, the storage controller 911 may be a SCSI controller and storage devices 913 may be SCSI discs. The I/O device 914 may be any sort of peripheral. For example, the I/O device 914 may be an local area network interface, such as an Ethernet card. The secondary bus bridge may be used to interface additional devices via another bus to the processing system. For example, the secondary bus bridge may be an universal serial port (USB) controller used to couple USB devices 917 via to the processing system 900. The multimedia processor 918 may be a sound card, a video capture card, or any other type of media interface, which may also be coupled to one additional devices such as speakers 919. The legacy device interface 920 is used to couple legacy devices, for example, older styled keyboards and mice, to the processing system 900.

The processing system 900 illustrated in FIG. 5 is only an exemplary processing system with which the invention may be used. While FIG. 5 illustrates a processing architecture especially suitable for a general purpose computer, such as a personal computer or a workstation, it should be recognized that well known modifications can be made to configure the processing system 900 to become more suitable for use in a variety of applications. For example, many electronic devices which require processing may be implemented using a simpler architecture which relies on a CPU 901 coupled to memory components 908 and/or memory devices 100. These electronic devices may include, but are not limited to audio/video processors and recorders, gaming consoles, digital television sets, wired or wireless telephones, navigation devices (including system based on the global positioning system (GPS) and/or inertial navigation), and digital cameras and/or recorders. The modifications may include, for example, elimination of unnecessary components, addition of specialized devices or circuits, and/or integration of a plurality of devices.

While the invention is preferably directed to methods for filling high aspect ratio contact vias, and the resulting structure, one skilled in the art will recognize that the invention is not limited to only filling high aspect ratio vias, but can be used to fill any type of vias or opening used in semiconductor devices.

Although certain advantages and preferred embodiments have been described above, those skilled in the art will recognize that substitutions, additions, deletions, modifications and/or other changes may be made without departing from the spirit or scope of the invention. Accordingly, the invention is not limited by the foregoing description but is only limited by the scope of the appended claims.

What is claimed as new and desired to be protected by Letters Patent of the United States is:

1. A method of forming a contact structure, said method comprising:

forming an insulating layer over a semiconductor substrate;

forming an opening in said insulating layer to an area containing silicon;

depositing a silicide forming material comprising nickel within said opening;

forming a silicide layer at the interface of said material and said area containing silicon;

removing at least a portion of said silicide forming material from said opening while leaving said silicide layer; and forming a conductor within said opening by plating over said silicide layer, wherein said conductor comprises any conductive metal substantially free from copper.

2. A method of forming a contact structure, said method comprising:

forming an insulating layer over a semiconductor substrate;

forming an opening in said insulating layer to an area comprising polysilicon;

depositing a silicide forming material within said opening;

forming a silicide layer at the interface of said material and said area containing silicon;

removing at least a portion of said silicide forming material from said opening while leaving said silicide layer; and forming a conductor within said opening by plating over said silicide layer, wherein said conductor comprises any conductive metal substantially free from copper.

3. A method of forming a contact structure, said method comprising:

forming an insulating layer over a semiconductor substrate;

forming an opening in said insulating layer to an area containing silicon;

depositing a silicide forming material within said opening;

forming a silicide layer at the interface of said material and said area containing silicon;

removing at least a portion of said silicide forming material from said opening while leaving said silicide layer; and forming a conductor within said opening by plating over said silicide layer, wherein said conductor comprises any conductive metal substantially free from copper, wherein said forming of a conductor comprises forming a conductor containing tantalum.

4. A method of forming a contact structure, said method comprising:

forming a gate stack on a semiconductor substrate, said gate stack comprising a gate oxide layer over a top surface of said substrate and a conductive polysilicon layer over said oxide layer;

forming an insulating layer over said gate stack and said substrate;

forming an opening in said insulating layer to said polysilicon layer of said gate stack;

depositing a silicide forming material within and surrounding said opening;

forming a silicide layer at the interface of said material and said polysilicon layer;

removing at least a portion of said silicide forming material from said opening while leaving said silicide layer; and forming a conductor within said opening by plating over said silicide layer.

5. The method of claim 4 wherein the step of forming an opening in said insulating layer comprises etching a via having a substantially circular, horizontal cross section.

6. The method of claim 4 wherein the silicide forming material comprises titanium.

7. The method of claim 6 wherein the step of depositing said silicide forming material is performed by a chemical vapor deposition process.

8. The method of claim 4 wherein the step of forming a silicide layer comprises heat annealing said silicide forming material.

9. The method of claim 4 wherein the silicide forming material comprises tungsten.

10. The method of claim 4 wherein the silicide forming material comprises cobalt.

11. The method of claim 4 wherein the silicide forming material comprises nickel.

12. The method of claim 4 further comprising the step applying an activating solution to the surface of the contact structure for removing oxides and oxide-containing compounds from said silicide layer.

13. The method of claim 12 wherein said activating solution comprises hydrofluoric acid.

14. The method of claim 13 wherein said activating solution further comprises palladium.

15. The method of claim 12 wherein the activating solution comprises a surfactant.

16. The method of claim 15 wherein said surfactant comprises Triton X-100.

17. The method of claim 15 wherein said surfactant comprises RE-610.

18. The method of claim 4 wherein forming a conductor comprises electrolessly plating a conductive metal.

19. The method of claim 18 wherein said conductive metal comprises at least one of nickel and cobalt.

20. The method of claim 19 wherein said conductive metal further comprises tungsten.

21. The method of claim 19 wherein said conductive metal further comprises tantalum.

22. The method of claim 19 wherein said conductive metal further comprises titanium.

23. The method of claim 18 wherein said conductive metal comprises cobalt and phosphorus.

24. The method of claim 18 wherein said conductive metal comprises nickel, phosphorus, and cobalt.

25. The method of claim 18 wherein the step of electroless plating comprises plating a conductive metal comprising nickel at approximately 6000 Angstroms per hour at a temperature of approximately 60 degrees Celsius.

* * * * *

UNITED STATES PATENT AND TRADEMARK OFFICE
CERTIFICATE OF CORRECTION

PATENT NO. : 6,787,450 B2
DATED : September 7, 2004
INVENTOR(S) : Nishant Sinha et al.

It is certified that error appears in the above-identified patent and that said Letters Patent is hereby corrected as shown below:

Column 5,
Line 34, change "coupled" to -- coupled with --;
Line 56, change "include" to -- includes --;
Line 66, change "911, an" to -- 911, a --;

Column 6,
Line 1, change "an" to -- a --;
Lines 4-5, change "also coupled" to -- also be coupled --;
Lines 15 and 19, change "an" to -- a --; and
Line 23, change "one additional devices" to -- one or more additional devices --.

Signed and Sealed this

Twelfth Day of July, 2005

JON W. DUDAS
*Director of the United States Patent and Trademark Office*